United States Patent [19]

Reddy

[11] Patent Number: 4,521,701
[45] Date of Patent: Jun. 4, 1985

[54] HIGH-SPEED LOW-POWER DELAYED CLOCK GENERATOR

[75] Inventor: Chitranjan N. Reddy, Houston, Tex.

[73] Assignee: Texas Instruments Incorporated, Dallas, Tex.

[21] Appl. No.: 419,118

[22] Filed: Sep. 16, 1982

[51] Int. Cl.³ .................... H03K 17/04; H03K 17/687
[52] U.S. Cl. ................................ 307/482; 307/443; 307/481; 307/578; 307/269
[58] Field of Search ............... 307/443, 453, 481–482, 307/578, 583, 262, 269

[56] References Cited

U.S. PATENT DOCUMENTS

| | | | |
|---|---|---|---|
| 4,061,933 | 12/1977 | Schroeder et al. | 307/481 X |
| 4,289,973 | 9/1981 | Eaton, Jr. | 307/443 X |
| 4,354,123 | 10/1982 | Eaton, Jr. | 307/482 X |
| 4,379,974 | 4/1983 | Plachno | 307/578 X |
| 4,401,904 | 8/1983 | White, Jr. et al. | 307/482 |
| 4,431,927 | 2/1984 | Eaton, Jr. et al. | 307/578 X |

OTHER PUBLICATIONS

Arzubi et al., "Bootstrap Driver Stage", *IBM Tech. Disc. Bull.*, vol. 23, No. 9, Feb. 1981, pp. 4185–4186.

Primary Examiner—Stanley D. Miller
Assistant Examiner—D. A. Hudspeth
Attorney, Agent, or Firm—John G. Graham

[57] ABSTRACT

A clock circuit for producing a high-level delayed clock output following an input clock employs an output transistor and pull-down transistor controlling an output node in response to the voltage on a drive node. The input clock is applied to this drive node by a decoupling arrangement, consisting of two series transistors. The first transistor isolates the input charge on a holding node, and the second of the series transistors transfers the charge to the drive node after the desired delay. The output node is held at zero until after the delay, with no unwanted voltage rise, and no d.c. power loss. A large capacitive load can be driven.

10 Claims, 5 Drawing Figures

HIGH-SPEED LOW-POWER DELAYED CLOCK GENERATOR

BACKGROUND OF THE INVENTION

This invention relates to semiconductor circuits, and more particularly to clock generator circuits of the type used in VLSI memory devices.

Semiconductor memory devices of the dynamic read/write type employ a large number of internally-generated clocks to control the sequence of events in reading and writing data in the array of storage cells. External clock such as chip enable and row and column address strobes $\overline{RAS}$ and $\overline{CAS}$ are used to initiate a series of dozens of internal clocks which have a wide variety of different delay times. These internal clocks need to go to a full Vdd supply voltage rather than Vdd-Vt, and must drive rather large capacitive loads. Of course, speed and power dissipation are of primary importance.

Dynamic RAM devices of the type which may employ the clock generator circuitry of the invention are disclosed in U.S. Pat. No. 4,239,993 issued to McAlexander, White and Rao, and U.S. Pat. No. 4,081,701 issued to White, McAdams and Redwine, and prior clock generator circuits are shown in U.S. Pat. No. 4,239,991 issued to Ngai Hong et al, and U.S. Pat. No. 4,239,990, issued to Hong, Reese and Redwine, all these patents assigned to Texas Instruments.

It is the principal object of this invention to provide an improved clock generator circuit as may be used in semiconductor integrated circuits, and in particular such a circuit which provides low power dissipation, greater efficiency, precise delay increments, and/or proper output zero-level control. Another object is to provide a clock generator which eliminates the initial excursion from the zero level inherent in prior circuits, referred to as the "front porch," so that level-sensitive circuits may be driven without indeterminte conditions.

SUMMARY OF THE INVENTION

In accordance with one embodiment of the invention, a clock circuit for producing a high-level delayed clock output following an input clock employs an output transistor and pull-down transistor controlling an output node in response to the voltage on a drive node. The input clock is applied to this drive node by a decoupling arrangement, consisting of two series transistors. The first transistor isolates the input charge on a holding node, and the second of the series transistors transfers the charge to the drive node after the desired delay. The output node is held at zero until after the delay, with no unwanted voltage rise, and no d.c. power loss. A large capacitive load can be driven.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
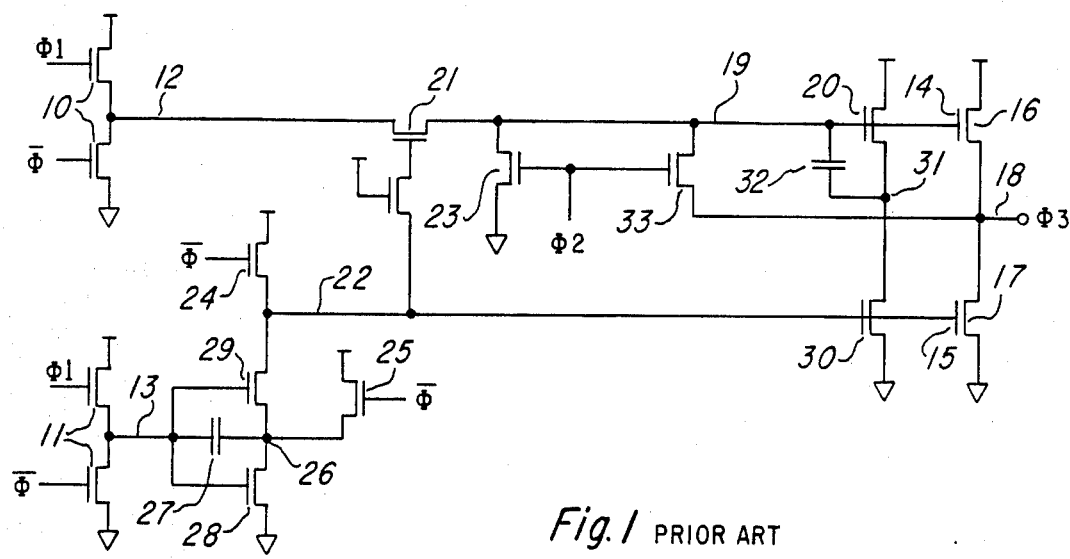
FIG. 1 is an electrical schematic diagram of a clock generator according to the prior art.

Referring to FIG. 1, a clock generator circuit of the type used in a VLSI type semiconductor memory device is illustrated. Typically, the memory device may be a 256K-bit dynamic read/write memory using one-transistor cells generally as shown in U.S. Pat. No. 4,239,993, issued to McAlexander, White & Rao, assigned to Texas Instruments. A number of high-level clocks must be generated on the chip in a memory device as in such patent; the clock voltages must drive capacitances of perhaps 50 to 100 pfd, at a voltage level at or very near the supply Vdd and the timing is a few nanoseconds.

Figure 2:
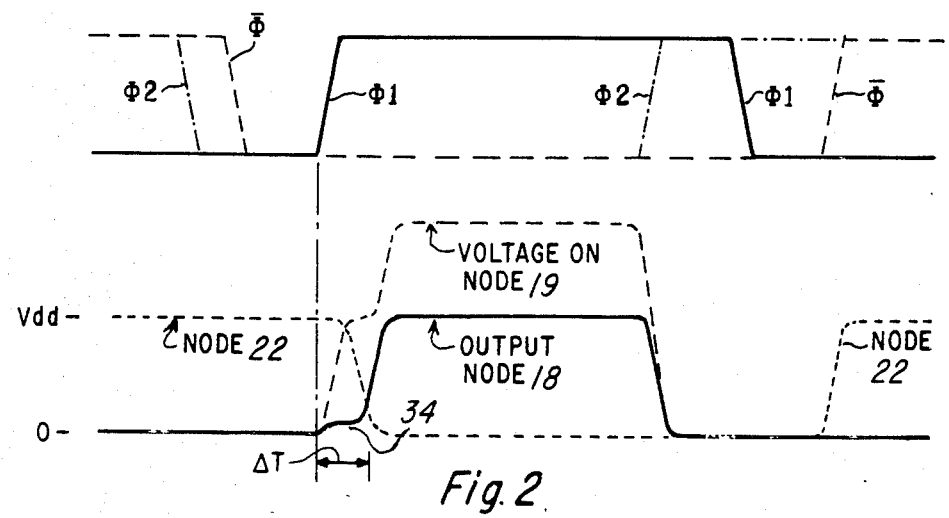
FIG. 2 is a graphic representation of voltage as a function of time for voltages appearing at various nodes in the circuit of FIG. 1.

The circuit of FIG. 1 functions to produce a delayed output clock $\Phi 3$ in response to an input clock $\Phi 1$ seen in FIG. 2. A precharge clock $\overline{\Phi}$ is used to set up the proper conditions before an active cycle begins. The output $\Phi 3$ has a leading edge delayed from the beginning of $\Phi 1$ by a time $\Delta T$, and has a trailing edge defined by a clock $\Phi 2$.

Two sets of input transistors 10 and 11 have gates connected to $\Phi 1$ and $\overline{\Phi}$ to provide the inputs at nodes 12 and 13. These nodes are held at Vss by $\overline{\Phi}$, then go to Vdd-Vt when $\Phi 1$ goes high. The input voltage at nodes 12 and 13 are used to derive voltages for controlling the gates 14 and 15 of an output driver transistor 16 and a pull-down transistor 17. The transistor 17 holds an output node 18 down at Vss during the time the precharge clock $\overline{\Phi}$ is high, and then the transistor 16 pulls the output node 18 to Vdd after a delay following the leading edge of $\Phi 1$. The gate 14 of the transistor 16 is the booted node 19 which is also connected to the gate of the transistor 20. A decoupling transistor connects the input node 12 to the node 19. The gate of this transistor 21 is connected to the delayed clock node 22 which also controls the gate is of transistor 17. The node 19 is predischarged by the $\Phi 2$ clock on the gate of the transistor 23, and then the output $\Phi 3$ is terminated when $\Phi 2$ goes high again and the node 19 is discharged via transistor 23. The node 22 is precharged to Vdd-Vt through transistor 24 when $\overline{\Phi}$ is high, so the transistor 21 conducts the charge on node 12 to the node 19 when $\Phi 1$ goes high. A transistor 25 also precharges a node 26 during $\overline{\Phi}$, but the nodes 22 and 26 do not discharge so long as node 13 is held down by $\overline{\Phi}$. When $\Phi 1$ goes high, node 13 goes high after a short delay (a few nanoseconds) needed to charge the gates of transistors 28 and 29. When the transistor 28 starts to conduct, the node 26 starts low, and this negative-going spike is coupled to the node 13 by the capacitor 27, tending to hold off the transistor 29 until the transistor 28 has discharged the node 26. When both of the transistors 28 and 29 are conductive, the node 22 discharges, pulling the gate 15 low, and also cutting off the transistors 21 to decouple the node 19 from the input. A transistor 30 in series with the transistor 20 is also turned off by the discharge of node 22, and this permits a node 31 to go high since the gate of transistor 20 has been driven high by the input clock voltage $\Phi 1$. The positive-going voltage on the node 31 is coupled to the node 19 to boot this node to above Vdd as seen in FIG. 2. The output node 18 and output clock Φ3 thus go to a full Vdd level. When Φ2 goes high, the node 19 is discharged through the transistor 23 and also through a transistor 33 and the pull-down device 17, terminating Φ3.

One undesirable feature of the circuit of FIG. 1 is that the output Φ3 exhibits a voltage excursion 34 at the beginning, during the delay ΔT. This excursion is referred to as a "front porch" and may present an unwanted operating condition if subsequent circuits are especially voltage sensitive. The voltage rise is caused by the fact that the gate voltage of the transistor 16 is high and so the transistor conducts, not only producing unwanted power dissipation in the transistor 17 but also producing a voltage drop across the output.

Figure 3:
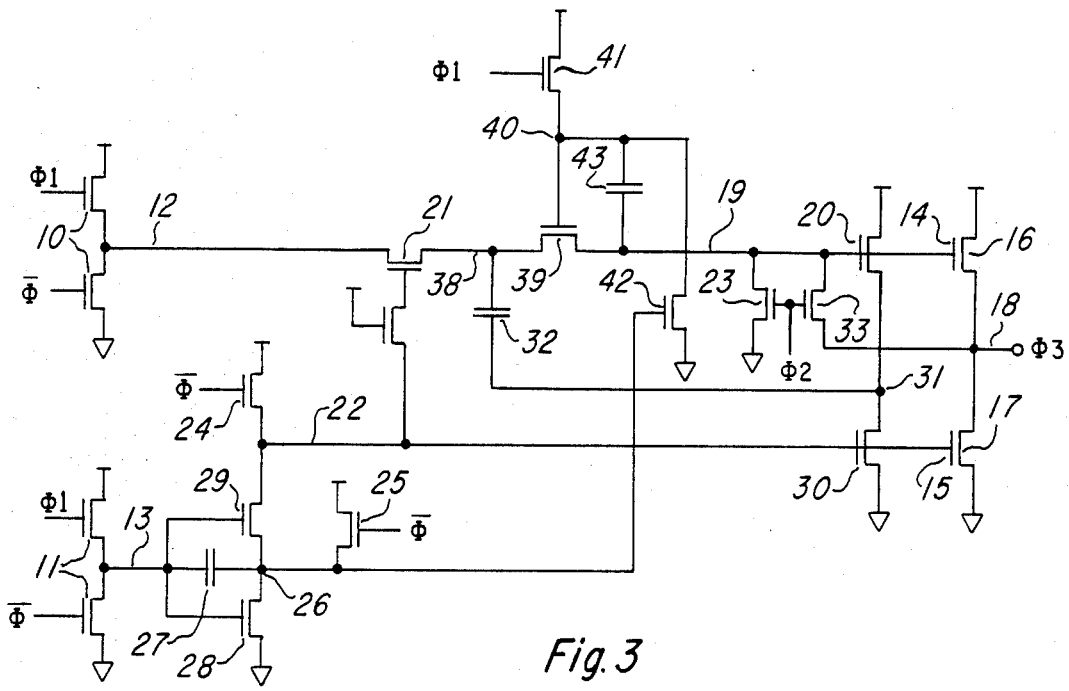
FIG. 3 is an electrical schematic diagram of a clock generator circuit according to the invention.

Referring now to FIG. 3, a clock generator circuit according to the invention is illustrated. In this circuit the charge from node 12 caused by Φ1 going high is trapped on a node 38, and is then transferred via transistor 39 to the drive node 19 when needed. The gate of the transfer transistor 39 is connected to a node 40 which is coupled to Vdd via transistor 41 driven by Φ1. The node 40 is also grounded via transistor 42 which has its gate connected to the node 26. A capacitor 43 functions to boot the node 40 when the drive node 19 starts high. The booting capacitor 32 is connected to the node 38 in FIG. 3 instead of being connected to the node 19 as in FIG. 1.

In the circuit of FIG. 3, when the input clock Φ1 goes high, the node 38 is charged via decoupling transistor 21 since the node 22 has been precharged when $\overline{\Phi}$ was high. As the node 38 is charged, the capacitor 32 is also charged. the node 40 is kept at ground via transistor 42 because the node 26 has been precharged to Vdd-Vt by transistor 25. After a delay caused by the delay circuitry, this node 26 goes low, first allowing the node 40 and capacitor 43 to charge through transistor 41 toward Vdd-Vt since Φ1 is high. The node 22 follows the node 26 with a very short delay, equal to the delay Δt in the transistor 29. As the node 40 is going toward the Vdd-Vt, charge from the node 38 is being transferred to the driving node 19 through transistor 39; at the same time the transistors 17 and 30 are being turned off, allowing the nodes 31 and 18 to rise. As the node 31 is rising, the node 38 gets booted above Vdd through capacitor 32 and this charge is being transferred on to the node 19 via transistor 39. As the voltage on the nodes 31 and 19 thus increase, the node 40 gets booted via capacitor 43, allowing the transistor 39 to become more conductive, thereby equalizing the voltage on the nodes 38 and 19.

The only charge being wasted in this operation is the current drawn through transistor 41, and this current is very small because it is driving only the gate of transistor 39 and the capacitor 43. Also, the "front porch" of the output waveform is completely eliminated because the resistive divider action no longer is present. This allows the device sizes of transistors 17 and 30 to be independent of the top devices 16 and 20, whereas in the prior art circuit there should be a ratio maintained between the top and bottom device to maintain a good zero level.

Figure 5:
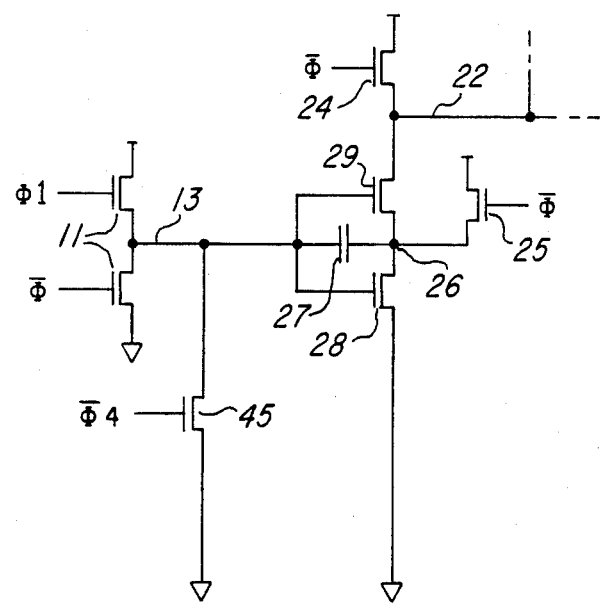
FIG. 5 is a circuit diagram of another embodiment of the circuit of FIG. 3.
Figure 5:
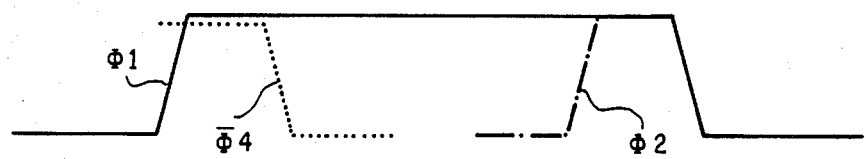

Referring to FIG. 5, interlocking with other clocks is provided by connecting a transistor 45 to the node 13, and applying a clock $\overline{\Phi4}$ to the gate of this transistor. All of the remainder of the circuit is exactly like FIG. 3. In this manner, the node 22 can be pulled down at a time delay after $\overline{\Phi4}$ goes low, providing another interlocked control. The clock $\overline{\Phi4}$ would occur after Φ1 but substantially before Φ2.

Figure 4:
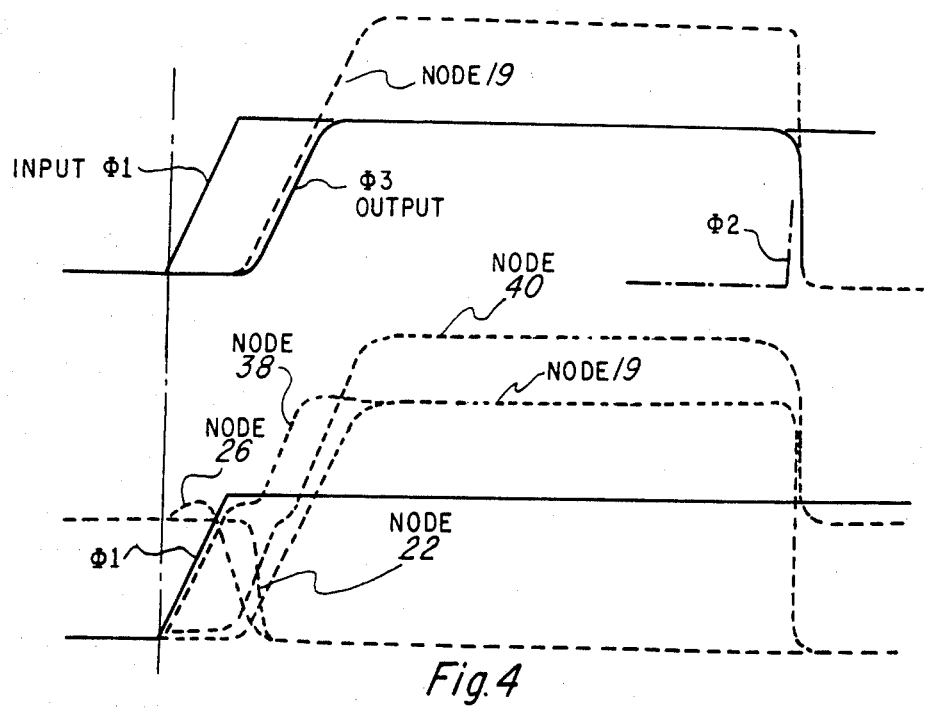
FIG. 4 is a graphic representation of voltage as a function of time for voltages appearing at various nodes in the circuit of FIG. 3.

Another advantage of the circuit of the invention is that only one type of transistor is needed. That is, instead of transistors of several different threshold such as "natural", enhancement, and depletion, requiring several implants in the manufacturing process, the circuit of FIG. 3 or 4 uses only standard enhancement transistors which have thresholds of about +0.8 v for a +5 v supply voltage. This makes the manufacturing process less costly.

It has been found that to drive a load capacitance of a given value the clock circuitry of the invention requires 50% less power compared to previous circuits.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A clock generator circuit for providing a high-level output clock voltage signal at an output node after a delay following an input clock voltage signal applied to an input node, comprising:

an input transistor, a transfer transistor, a grounding transistor, a control transistor, a driver transistor, and a hold-down transistor, each of the transistors having a source-drain path and a gate;

the source-drain path of the input transistor being connected between the input node and a holding node, and means precharging the gate of the input transistor prior to said clock input voltage signal;

the source-drain path of the transfer transistor being connected between the holding node and a drive node, the gate of the transfer transistor being connected to a control node;

the source-drain path of the control transistor connecting the control node to a supply voltage, the gate of the control transistor being connected to receive the clock input voltage signal;

the source-drain path of the grounding transistor connecting the control node to ground, the gate of the grounding transistor receiving a precharge signal prior to the clock input voltage signal;

the source-drain path of the driver transistor connecting the output node to the supply voltage, the gate of the driver transistor being connected to the drive node;

the source-drain path of the hold-down transistor connecting the output node to ground, the gate of the hold-down transistor receiving a precharge signal prior to said clock input voltage;

and delay means connected to pull down the gates of the hold-down transistor and the grounding transistor after a time delay following occurrence of said input clock voltage signal; and capacitive means coupling the output node to the holding node to bootstrap the voltage on the holding node when the output node voltage rises.

2. A circuit according to claim 1 including capacitive means coupling the drive node to the control node to bootstrap the voltage on the control node when the drive node voltage rises.

3. A circuit according to claim 1 wherein the delay means functions to pull down the gate of the grounding transistor slightly before pulling down the gate of the hold-down transistor.

4. A circuit according to claim 1 wherein the delay means is also connected to pull down the gate of the input transistor after said delay.

5. A circuit according to claim 1 wherein all of said transistors are insulated gate field effect transistors of the same threshold voltage formed in a single integrated circuit.

6. In a dynamic read/write semiconductor memory device or the like, a clock generator circuit for providing a high-level output clock voltage signal at an output node after a delay following an input clock voltage signal applied to an input node, comprising:

an input transistor, a transfer transistor, a grounding transistor, a control transistor, a driver transistor, and a hold-down transistor, each of the transistors having a source-drain path and a gate;

the input transistor having its source-drain path connected between the input node and a holding node, and means precharging the gate of the input transistor prior to said clock input voltage signal;

the transfer transistor having its source-drain path connected between the holding node and a drive node, the gate of the transfer transistor being connected to a control node;

the control transistor having its source-drain path connecting the control node to a supply voltage, the gate of the control transistor being connected to receive the clock input voltage signal;

the grounding transistor having its source-drain path connecting the control node to ground, the gate of the grounding transistor being precharged prior to the clock input voltage signal;

the driver transistor having its source-drain path connecting the output node to the supply voltage, the gate of the driver transistor being connected to the drive node;

the hold-down transistor having its source-drain path connecting the output node to ground, the gate of the hold-down transistor receiving a precharge signal prior to said clock input voltage signal;

delay means connected to pull down the gates of the hold-down transistor and the grounding transistor after a delay following occurrence of the clock input voltage signal, and capacitive means coupling the output node to the holding node to bootstrap the voltage on the holding node when the output node voltage rises.

7. A circuit according to claim 6 including capacitive means coupling the drive node to the control node to bootstrap the voltage in the control node when the drive node voltage rises.

8. A circuit according to claim 6 wherein the delay means functions to pull down the gate of the grounding transistor slightly before pulling down the gate of the hold-down transistor.

9. A circuit according to claim 6 wherein the delay means is also connected to pull down the gate of the input transistor after said delay.

10. A circuit according to claim 6 wherein all of said transistors are insulated gate field effect transistors of the same threshold voltage formed in a single integrated circuit.

* * * * *